(12) United States Patent
Timans

(10) Patent No.: US 7,135,656 B2
(45) Date of Patent: Nov. 14, 2006

(54) APPARATUS AND METHOD FOR REDUCING STRAY LIGHT IN SUBSTRATE PROCESSING CHAMBERS

(75) Inventor: Paul Janis Timans, Mountain View, CA (US)

(73) Assignee: Mattson Technology, Inc., Fremont, CA (US)

( * ) Notice: Subject to any disclaimer, the term of this patent is extended or adjusted under 35 U.S.C. 154(b) by 0 days.

(21) Appl. No.: 11/020,806

(22) Filed: Dec. 22, 2004

(65) Prior Publication Data

US 2005/0098552 A1 May 12, 2005

Related U.S. Application Data

(63) Continuation of application No. 10/288,271, filed on Nov. 5, 2002, now Pat. No. 6,835,914.

(51) Int. Cl.
*F27B 5/14* (2006.01)

(52) U.S. Cl. ............ 219/390; 219/405; 219/411; 392/416; 392/418; 118/724; 118/725; 118/50.1; 501/50; 501/64; 428/428

(58) Field of Classification Search ............ 219/390, 219/405, 411; 392/416, 418; 118/724, 725; 118/50.1; 501/50, 64; 428/428
See application file for complete search history.

(56) References Cited

U.S. PATENT DOCUMENTS

| | | | |
|---|---|---|---|
| 3,959,171 A | 5/1976 | Woodcock | |
| 4,106,857 A | 8/1978 | Snitzer | |
| 4,563,494 A | 1/1986 | Ida | |
| 4,566,987 A | 1/1986 | Gliemeroth et al. | |
| 4,686,196 A | 8/1987 | Gliemeroth et al. | |
| 4,730,902 A | 3/1988 | Suzuki et al. | |
| 5,061,084 A | 10/1991 | Thompson et al. | |
| 5,116,113 A | 5/1992 | Chu | |
| 5,137,850 A | 8/1992 | Clement et al. | |
| 5,154,512 A | 10/1992 | Schietinger et al. | |
| 5,155,336 A | 10/1992 | Gronet et al. | |
| 5,188,458 A | 2/1993 | Thompson et al. | |
| 5,211,885 A | 5/1993 | Zepp | |

(Continued)

FOREIGN PATENT DOCUMENTS

WO   WO 9607071 A1   3/1996

(Continued)

OTHER PUBLICATIONS

Article—*Rapid Thermal Processing Systems: A Review With Emphasis On Temperature Control*, Fred Roozeboom and N. Parekh, J. Vac. Sci. Technol. B, vol. 8, No. 6, Nov./Dec. 1990, pp. 1249-1259.

*Primary Examiner*—Shawntina Fuqua
(74) *Attorney, Agent, or Firm*—Dority & Manning, P.A.

(57) ABSTRACT

A method and apparatus for heating semiconductor wafers in thermal processing chambers. The apparatus includes a non-contact temperature measurement system that utilizes radiation sensing devices, such as pyrometers, to determine the temperature of the wafer during processing. The radiation sensing devices determine the temperature of the wafer by monitoring the amount of radiation being emitted by the wafer at a particular wavelength. In accordance with the present invention, a spectral filter is included in the apparatus for filtering light being emitted by lamps used to heat the wafer at the wavelength at which the radiation sensing devices operate. The spectral filter includes a light absorbing agent such as a rare earth element, an oxide of a rare earth element, a light absorbing dye, a metal, or a semiconductor material.

39 Claims, 4 Drawing Sheets

U.S. PATENT DOCUMENTS

| | | | |
|---|---|---|---|
| 5,270,854 A | 12/1993 | Lee et al. |
| 5,315,443 A | 5/1994 | Taira et al. |
| 5,326,171 A | 7/1994 | Thompson et al. |
| 5,413,971 A | 5/1995 | McPherson |
| 5,660,472 A | 8/1997 | Peuse et al. |
| 5,820,261 A | 10/1998 | Yam |
| 5,820,942 A | 10/1998 | Singh et al. |
| 5,830,277 A | 11/1998 | Johnsgard et al. |
| 5,874,711 A | 2/1999 | Champetier et al. |
| 5,930,456 A | 7/1999 | Vosen |
| 5,960,158 A | 9/1999 | Gat et al. |
| 5,970,214 A | 10/1999 | Gat |
| 5,970,382 A | 10/1999 | Shah |
| 5,980,637 A | 11/1999 | Singh et al. |
| 5,997,175 A | 12/1999 | Champetier et al. |
| 6,007,241 A | 12/1999 | Yam et al. |
| 6,027,244 A | 2/2000 | Champetier et al. |
| 6,034,357 A | 3/2000 | Guardado |
| 6,040,120 A | 3/2000 | Matsushita et al. |
| 6,056,433 A | 5/2000 | Yam |
| 6,056,434 A | 5/2000 | Champetier |
| 6,075,922 A | 6/2000 | Tay et al. |
| 6,086,245 A | 7/2000 | Yam |
| 6,117,370 A | 9/2000 | Hasegawa et al. |
| 6,127,658 A | 10/2000 | Kohav |
| 6,136,904 A | 10/2000 | Amano et al. |
| 6,160,242 A | 12/2000 | Guardado |
| 6,174,080 B1 | 1/2001 | Jennings |
| 6,174,651 B1 | 1/2001 | Thakur |
| 6,179,465 B1 | 1/2001 | Yam |
| 6,183,130 B1 | 2/2001 | Adams et al. |
| 6,200,023 B1 | 3/2001 | Tay et al. |
| 6,200,634 B1 | 3/2001 | Johnsgard et al. |
| 6,204,484 B1 | 3/2001 | Tay et al. |
| 6,210,484 B1 | 4/2001 | Hathaway |
| 6,222,990 B1 | 4/2001 | Guardado et al. |
| 6,239,413 B1 | 5/2001 | Abe |
| 6,280,081 B1 | 8/2001 | Blau et al. |
| 6,281,141 B1 | 8/2001 | Das et al. |
| 6,293,696 B1 | 9/2001 | Guardado |
| 6,310,328 B1 | 10/2001 | Gat |
| 6,345,909 B1 | 2/2002 | Yam |
| 6,359,263 B1 | 3/2002 | Tay et al. |
| 6,376,806 B1 | 4/2002 | Yoo |
| 6,403,923 B1 | 6/2002 | Tay et al. |
| 6,406,179 B1 | 6/2002 | Adams et al. |
| 6,514,876 B1 | 2/2003 | Thakur et al. |
| 6,559,424 B1 | 5/2003 | O'Carroll et al. |
| 6,610,967 B1 | 8/2003 | Gat |
| 6,638,876 B1 | 10/2003 | Levy et al. |
| 6,717,158 B1 | 4/2004 | Gat et al. |
| 6,727,474 B1 | 4/2004 | Gat |
| 6,770,146 B1 | 8/2004 | Koren et al. |
| 6,771,895 B1 | 8/2004 | Gat et al. |
| 6,797,312 B1 | 9/2004 | Kong et al. |
| 6,808,758 B1 | 10/2004 | Thakur |
| 2002/0137311 A1 | 9/2002 | Timans |
| 2003/0031793 A1 | 2/2003 | Chang et al. |
| 2003/0124820 A1 | 7/2003 | Johnsgard et al. |
| 2003/0209326 A1 | 11/2003 | Lee et al. |
| 2003/0235983 A1 | 12/2003 | Li et al. |
| 2003/0236642 A1 | 12/2003 | Timans |
| 2004/0018008 A1 | 1/2004 | Koren et al. |
| 2004/0025787 A1 | 2/2004 | Selbrede et al. |
| 2004/0035847 A1 | 2/2004 | Gat |
| 2004/0058557 A1 | 3/2004 | Eisele et al. |
| 2005/0006916 A1 | 1/2005 | Mantz |
| 2005/0008351 A1 | 1/2005 | Gat et al. |

FOREIGN PATENT DOCUMENTS

| | | |
|---|---|---|
| WO | WO 0145501 A2 | 6/2001 |
| WO | WO 0145501 A3 | 6/2001 |
| WO | WO 02053800 A2 | 7/2002 |
| WO | WO 02053800 A3 | 7/2002 |

APPARATUS AND METHOD FOR REDUCING STRAY LIGHT IN SUBSTRATE PROCESSING CHAMBERS

RELATED APPLICATIONS

The present application is a continuation of U.S. patent application Ser. No. 10/288,271 filed on Nov. 5, 2002 and issued as U.S. Pat. No. 6,835,914.

BACKGROUND OF THE INVENTION

A thermal processing chamber refers to a device that uses energy, such as radiative energy, to heat objects, such as semiconductor wafers. Such devices typically include a substrate holder for holding a semiconductor wafer and a light source that emits light energy for heating the wafer. For monitoring the temperature of the semiconductor wafer during heat treatment, thermal processing chambers also typically include radiation sensing devices, such as pyrometers, that sense the radiation being emitted by the semiconductor wafer at a selected wavelength. By sensing the thermal radiation being emitted by the wafer, the temperature of the wafer can be calculated with reasonable accuracy.

One major problem in the design of rapid thermal processing chambers having an optical temperature measurement system, however, has been the ability to prevent unwanted light radiated by the heater lamps from being detected by the pyrometric instrumentation. Should unwanted light not being emitted by the semiconductor wafer be detected by the pyrometer, the calculated temperature of the wafer may unreasonably deviate from the actual or true temperature of the wafer.

In the past, various methods have been used to prevent unwanted thermal radiation from being detected by the pyrometer. For instance, physical barriers have been used before to isolate and prevent unwanted light being emitted by the heater lamps from coming into contact with the pyrometer. Physical barriers have been especially used in rapid thermal processing chambers in which the heater lamps are positioned on one side of the semiconductor wafer and the pyrometer is positioned on the opposite side of the wafer.

Physical barriers, however, can restrict the system design. For instance, the physical barrier can restrict how the wafer is supported. In one embodiment, a light-tight enclosure is created below the wafer using a large diameter continuous support ring to hold the wafer at it edges. When a support ring is present, there can be overlap between the support ring and the edges of the wafer, which can lead to temperature non-uniformities in the wafer during heating cycles. Another problem can arise if the support ring or the wafer is warped even slightly. When this occurs, light can stray through the gap into the supposedly light-tight region. The stray light can induce errors in the pyrometer readings.

Besides physical barriers, spectral filters have also been used to limit the amount of light interference detected by the pyrometers. For instance, spectral filters can operate by removing light being emitted by the heater lamps at the wavelength at which the pyrometer operates. Preferably, spectral filters absorb unwanted thermal radiation while at the same time being transparent to the thermal radiation being emitted by the heater lamps that is necessary to heat the semiconductor wafer.

One type of spectral filter that has been used in the past is a window made from fused silica, such as silica doped with hydroxy (OH) ions. Fused silica glass is transparent to most light energy but is known to have several strong absorbing regions that are maximized at wavelengths of about 2.7 microns, 4.5 microns and at wavelengths equal to and greater than 5 microns.

Because certain OH-doped silica glass can effectively absorb light at wavelengths of 2.7, 4.5 and greater than 5 microns and is substantially transparent at many other smaller wavelengths of light, silica glass makes an effective spectral filter when the pyrometer contained within the thermal processing chamber is configured to sense thermal radiation at one of the above wavelengths.

Silica glass, however, is unfortunately not well suited to being used as a spectral filter in temperature measurement systems that contain pyrometers that sense thermal radiation at shorter wavelengths, such as less than about one micron. Specifically, in some applications, it is more advantageous and beneficial to operate pyrometers at relatively short wavelengths. In particular, by using pyrometers that operate at shorter wavelengths, the effects of wafer emissivity variations can be minimized providing for more accurate temperature determinations. Specifically, at lower wavelengths, silicon wafers are more opaque and the emissivity of the wafer is not significantly temperature dependent. The emissivity of the wafer is one variable that must be known with some accuracy in determining the temperature of wafers using pyrometers.

In addition to more precisely determining the temperature of wafers, pyrometers that operate at relatively shorter wavelengths are also generally less expensive and less complicated then pyrometers that are configured to operate at higher wavelengths. Further, pyrometers that sense thermal radiation at lower wavelengths generally operate very efficiently and can generate low noise measurements.

In the past, however, pyrometers that operate at lower wavelengths have been selectively used in thermal processing chambers due to the significant amount of stray light that can be detected in thermal processing chambers at lower wavelengths. As such, a need currently exists for a spectral filter that can efficiently absorb light energy at lower wavelengths, such as wavelengths less than about 2 microns.

SUMMARY OF THE INVENTION

The present invention is generally directed to an apparatus and method for heat treating semiconductor devices. The apparatus includes a thermal processing chamber adapted to contain a semiconductor wafer. A radiant energy source including at least one lamp is used to emit light energy into the chamber. At least one radiation sensing device is located within the thermal processing chamber and is configured to sense thermal radiation at a preselected wavelength being emitted by a semiconductor wafer being heat treated.

In accordance with the present invention, the apparatus further includes a spectral filter that is configured to absorb thermal radiation being emitted by the light source at the preselected wavelength at which the radiation sensing device operates. The spectral filter comprises a light absorbing agent. The light absorbing agent can be, for instance, a rare earth element, a light absorbing dye, a metal, or a semiconductor material. For example, in one embodiment, the spectral filter comprises a host material doped with a rare earth element. The rare earth element can be ytterbium, neodymium, thulium, erbium, holmium, dysprosium, terbium, gadolinium, europium, samarium, praseodymium, or mixtures thereof.

In an alternative embodiment, the spectral filter comprises a host material doped with a metal, such as a transition metal. Particular metals that can be used, include, for instance, iron and copper.

The host material can be a liquid, a glass, a crystal, a plastic or a ceramic. Of particular advantage, when the spectral filter contains a rare earth element, the spectral filter can be configured to absorb light energy at a wavelength of less than about 2 microns, such as from about 0.5 microns to about 1.5 microns, and particularly from about 0.6 microns to about 1.1 microns. For example, in one embodiment, the spectral filter can be ytterbium contained in a glass material in an amount of at least 0.5% by weight, and particularly in an amount of at least about 20% by weight. In this embodiment, the spectral filter can be configured to absorb light at a wavelength of between about 900 nm to about 1010 nm.

As described above, the amount of the light absorbing agent present within the host material can be measured in units of percentage by weight. For example, for many applications, the light absorbing agent can be present in the host material in an amount from about 0.5% to about 50% by weight. In some applications, however, it may be more appropriate to use atomic composition as a measure of concentration instead of weight percentages. For example, the light absorbing agent can be present in the host material at an atomic composition concentration (mole percent) of from about 0.5% to about 50%. The atomic composition concentration can vary depending upon the particular host material and the particular light absorbing agents selected.

In an alternative embodiment, the rare earth element can be in the form of a rare earth element compound, such as an oxide. The rare earth element compound can be contained in a ceramic material and used as a spectral filter in accordance with the present invention.

As described above, in another embodiment, the light absorbing agent can be a light absorbing dye. The dye can be, for instance, an organic salt dye, a nickel complex dye, a precious metal dye such as a platinum complex dye or a palladium dye, a phalocyanine dye, or an anthraquinone or a mixture thereof. Such dyes are also well-suited to absorbing light at wavelengths less than about 2 microns.

In addition to rare earth elements and light absorbing dyes, the spectral filter can also be made from a semiconductor material. The semiconductor material can be, for instance, gallium arsenide, aluminum arsenide, germanium, silicon, indium phosphide, or alloys of these materials, such as Si/Ge; AlAs/GaAs/InP.

Spectral filters made in accordance with the present invention can have an attenuation factor of at least 5 at the wavelength of interest. For instance, the spectral filter can have an attenuation factor of at least $10^3$, and particularly can have an attenuation factor of at least $10^5$ at the wavelength of interest. Further, the above attenuation factors can be obtained having a relatively thin material. For instance, the spectral filter can have a thickness of less than about 1 inch, and particularly less than about 100 mm.

The spectral filter can be positioned in association with the light sources in the apparatus of the present invention at various locations. For instance, in one embodiment, the spectral filter can be positioned in between the thermal processing chamber and the light sources. In an alternative embodiment, however, the spectral filter can be used to surround a lamp or a radiant energy filament. In still another alternative embodiment, the spectral filter can be incorporated into a reflector that is positioned behind the light sources.

Other features and aspects of the present invention are discussed in greater detail below.

BRIEF DESCRIPTION OF THE DRAWINGS

A full and enabling disclosure of the present invention, including the best mode thereof, directed to one of ordinary skill in the art, is set forth more particularly in the remainder of the specification, which makes reference to the appended figures in which.

Figure 1:
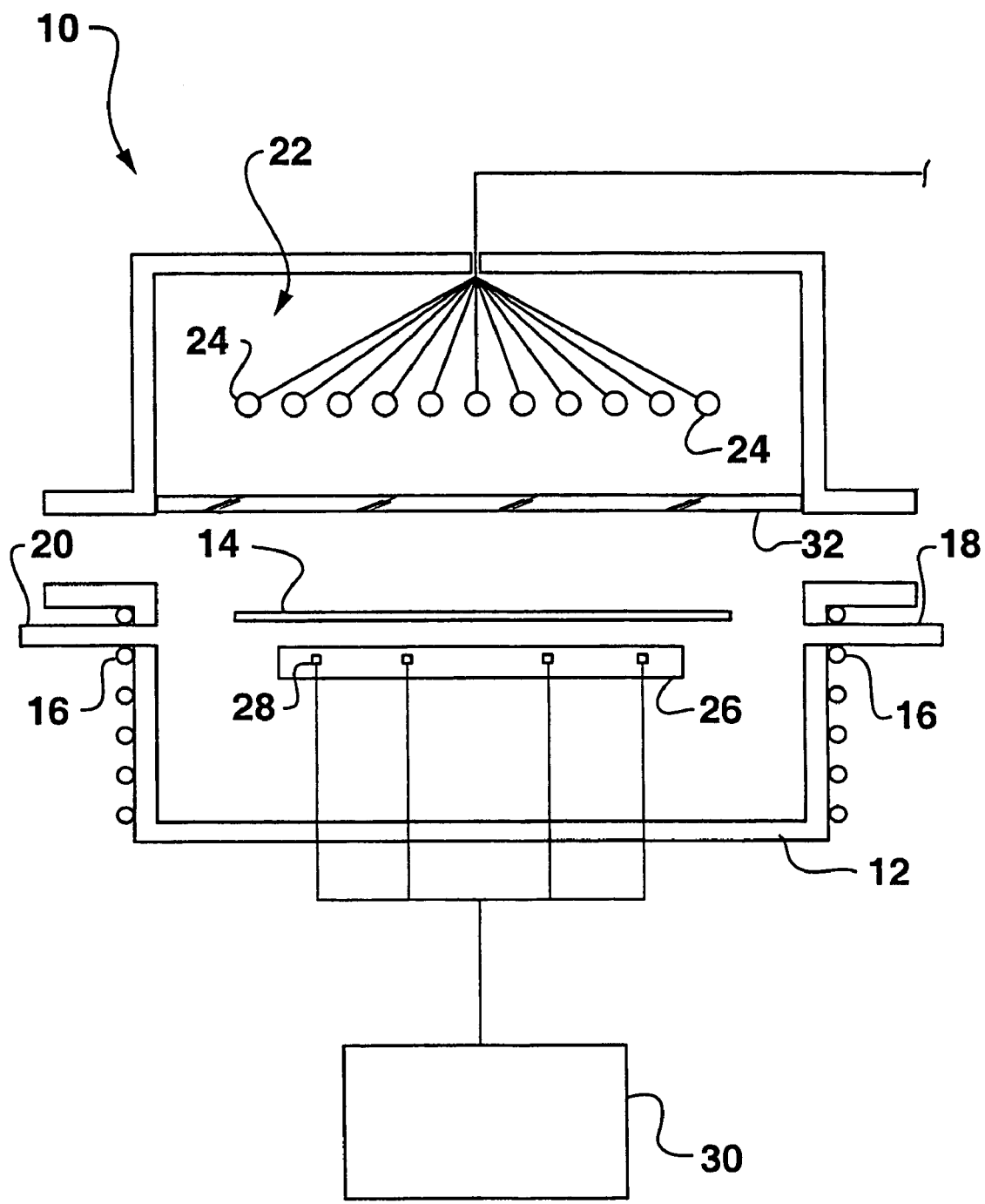
FIG. 1 is a cross-sectional view of one embodiment of an apparatus for heat treating semiconductor devices in accordance with the present invention.

Repeat use of reference characters in the present specification and drawings is intended to represent same or analogous features or elements of the invention.

DETAILED DESCRIPTION OF THE PREFERRED EMBODIMENTS

It is to be understood by one of ordinary skill in the art that the present discussion is a description of exemplary embodiments only, and is not intended as limiting the broader aspects of the present invention which broader aspects are embodied in the exemplary construction.

In general, the present invention is directed to an apparatus and method for heating semiconductor wafers while accurately monitoring the temperature of the wafer. The apparatus includes a thermal processing chamber in communication with a light source that is used to heat semiconductor wafers contained in the chamber. A radiation sensing device, such as a pyrometer, is in communication with the chamber and is positioned to sense thermal radiation at a particular wavelength being emitted by a semiconductor wafer. By sensing the thermal radiation being emitted by the wafer at a particular wavelength, the pyrometer can be used to calculate the temperature of the wafer during operation of the thermal processing chamber.

In accordance with the present invention, the apparatus further includes a spectral filter positioned in communication with the light source. The spectral filter absorbs light energy emitted by the light source at the wavelength at which the radiation sensing device operates in order to prevent the absorbed light from being detected by the radiation sensing device and interfering with any temperature measurements being taken. The spectral filter, however, is substantially transparent to light energy being emitted by the light source that is needed for heating a semiconductor wafer contained in the chamber.

In accordance with the present invention, various materials can be used to construct the spectral filter. For example, in one embodiment, the spectral filter can include a host material containing a light absorbing agent. The light absorbing agent can be, for instance, a rare earth element or a light absorbing dye. Examples of rare earth elements that can be used in accordance with the present invention include ytterbium, neodymium, thulium, erbium, holmium, dysprosium, terbium, gadolinium, europium, samarium, praseodymium, and mixtures thereof.

Light absorbing dyes that can be used in accordance with the present invention include, organic salt dyes, nickel complex dyes, precious metal dyes, such as platinum complex dyes and palladium complex dyes, phalocyanine dyes, anthraquinone dyes, and mixtures thereof.

In alternative embodiments, the spectral filter can be made from a compound containing a rare earth element (such as an oxide) or a semiconductor material. The rare earth element compound can be a compound of any of the rare earth elements described above. Examples of semiconductor materials that can be used as a spectral filter include gallium arsenide, aluminum arsenide, indium phosphide, silicon, germanium, or alloys of these materials. When using a semiconductor material as a spectral filter, the spectral filter may need to be cooled during heating of semiconductor wafers contained in the thermal processing chamber depending upon the position of the spectral filter.

The present invention provides various benefits and advantages in determining the temperature of wafers during heating processes. In particular, the spectral filter can absorb and eliminate unwanted radiation from being sensed by the radiation sensing device for more accurately determining the temperature of the wafers. Of particular advantage, in one embodiment, a spectral filter made in accordance with the present invention can be chosen that is very efficient at absorbing light at relatively short wavelengths, such as wavelengths less than about 2 microns, and particularly at wavelengths less than about 1 micron. In other embodiments, however, spectral filters made in accordance with the present invention can be designed to absorb light at wavelengths longer than 2 microns which may be desired in some applications.

Referring to FIG. 1, an apparatus generally 10 made in accordance with one embodiment of the present invention for processing semiconductor devices, such as silicon wafers, is shown. Apparatus 10 includes a processing chamber 12 adapted to receive substrates such as a semiconductor wafer 14 for conducting various processes. Chamber 12 is designed to heat wafer 14 at rapid rates and under carefully controlled conditions. Chamber 12 can be made from various materials, including metals and ceramics. For instance, chamber 12, in one embodiment, can be made from stainless steel.

When chamber 12 is made from a heat conductive material, the chamber can include a cooling system. For instance, as shown in FIG. 1, chamber 12 includes a cooling conduit 16 wrapped around the perimeter of the chamber. Conduit 16 is adapted to circulate a cooling fluid, such as water, which is used to maintain the walls of chamber 12 at a constant temperature.

Chamber 12 can also include a gas inlet 18 and a gas outlet 20 for introducing a gas into the chamber and/or for maintaining the chamber within a preset pressure range. For instance, a gas can be introduced into chamber 12 through gas inlet 18 for reaction with wafer 14. Once processed, the gas can then be evacuated from the chamber using gas outlet 20.

Alternatively, an inert gas can be fed to chamber 12 through gas inlet 18 for preventing any unwanted or undesirable side reactions from occurring within the chamber. In a further embodiment, gas inlet 18 and gas outlet 20 can be used to pressurize chamber 12. A vacuum can also be created in chamber 12 when desired, using gas outlet 20 or an additional larger outlet positioned beneath the level of the wafer.

During processing, chamber 12, in one embodiment, can be adapted to rotate wafer 14. Rotating the wafer promotes greater temperature uniformity over the surface of the wafer and promotes enhanced contact between wafer 14 and any gases introduced into the chamber. It should be understood, however, that besides wafers, chamber 12 is also adapted to process optical parts, films, fibers, ribbons and other substrates having any particular shape.

A light source generally 22 is included in communication with chamber 12 for emitting light energy and heating wafer 14 during processing. In this embodiment, light source 22 includes a plurality of lamps 24. Lamps 24 can be incandescent lamps, such as tungsten-halogen lamps, arc lamps, or the like. Light source 22 can include a reflector or a set of reflectors for carefully directing light energy being emitted by lamps 24 uniformly onto wafer 14. As shown in FIG. 1, lamps 24 are placed above wafer 14. It should be understood, however, that lamps 24 may be placed at any particular location. Further, additional or less lamps could be included within apparatus 10 as desired.

In some thermal processing apparatuses, the use of lamps 24 as a heat source is preferred. For instance, lamps have much higher heating and cooling rates than other heating devices. Lamps 24 create a rapid thermal processing system that provides instantaneous energy, typically requiring a very short and well controlled start up period. The flow of energy from lamps 24 can also be abruptly stopped at any time. The lamps can be equipped with gradual power controls and can be connected to a controller that automatically adjusts the amount of light energy being emitted by the lamps based on temperature measurements of the wafer.

In addition to lamps 24, however, the apparatus 10 can also include a susceptor positioned within the thermal processing chamber 12 at a location adjacent to the wafer 14. The susceptor can include a heating element, such as an electrical resistance heater or an induction heater for heating the wafer in addition to the lamps.

Semiconductor wafer 14 is supported within thermal processing chamber 12 by a substrate holder 26. Substrate holder 26, in this embodiment, also supports a plurality of optical fibers or light pipes 28 which are, in turn, in communication with a radiation sensing device(s) 30, such as a pyrometer(s). Alternatively to the embodiment illustrated in FIG. 1, each optical fiber 28 can be connected to a separate radiation sensing device if desired.

In a further embodiment, the use of optical fibers may not be necessary in order to transmit radiant energy to the pyrometers. For example, simple lens systems can be used instead of optical fibers. Further, in other embodiments, the pyrometers can be placed in a direct line of sight with the substrate being processed. The particular arrangement of the temperature measurement device in the apparatus of the present invention depends on the configuration and the particular application.

Optical fibers 28 are configured to receive thermal radiation being emitted by wafer 14 at a particular wavelength. The amount of sensed radiation is then communicated to radiation sensing device 30 which generates a usable voltage signal for determining the temperature of the wafer.

In this embodiment, apparatus 10 is designed such that optical fibers 28 only detect thermal radiation being emitted by the wafer and do not detect substantial amounts of radiation being emitted by lamps 24. In this regard, apparatus 10 includes a spectral filter 32 positioned between light source 22 and radiation sensing device 30. The spectral filter substantially prevents thermal radiation being emitted by lamps 24 at the wavelength at which radiation sensing device 30 operates from entering chamber 12.

In accordance with one embodiment of the present invention, the spectral filter 32 includes a light absorbing agent contained within a host material. In general, the spectral filter 32, on one hand, prevents thermal radiation being emitted by the lamps 24 at the wavelength at which the radiation sensing device 30 operates from entering the chamber 12, while, on the other hand, permitting the transmission of radiation at other wavelengths in amounts sufficient to heat the wafer 14. Generally speaking, the spectral filter 32 can be designed according to the present invention to filter many different wavelengths and wavelength ranges.

In one particular embodiment, the spectral filter 32 is designed to filter relatively short wavelengths. For example, in the case of semiconductor materials, it can be more convenient to use radiation sensing devices that sense at wavelengths below the semiconductor absorption edge, which corresponds to a photon energy higher than the semiconductor band gap. At these wavelengths, the sample will generally be opaque at the measurement wavelength. Consequently, transmission of the sample does not vary strongly with temperature and wafer doping, as is usually the case for wavelengths beyond the absorption edge.

At lower wavelengths, Plank's Law used to calculate temperature develops a very strong temperature dependence. Consequently, at smaller wavelengths, very large decreases in signal strength as the temperature drops may be experienced. Thus, the lowest temperature that can be reliably measured in a thermal processing chamber will usually be limited either by noise in the detection system or by stray light that cannot be distinguished from wafer signal. As a result, the ratio of wafer radiation to stray light tends to improve as the detection wavelength increases. Consequently, in some embodiments, relatively accurate results are obtained when the temperature measurement devices operate at a wavelength of from about 0.5 microns to about 1.5 microns, and particularly from about 0.8 microns to about 1.1 microns. Spectral filters made in accordance with the present invention can be designed to filter wavelengths within the above ranges.

As described above, in one embodiment, the spectral filter 32 includes a light absorbing agent contained within a host material. In accordance with the present invention, the light absorbing agent can be, for instance, a rare earth element or a light absorbing dye. The host material for the light absorbing agent can be, for instance, glass, ceramics, crystals, and the like.

Once constructed, the spectral filter should be capable of effectively filtering thermal radiation at the wavelength of interest, which is the wavelength at which the radiation sensing device operates. In this regard, the absorption coefficient of the spectral filter has to be high enough to provide the desired attenuation of radiation at the wavelength of interest. For example, for most applications, the spectral filter should have an attenuation factor of at least 5, particularly at least 100, and more particularly at least 1000. For example, in one embodiment, the attenuation factor can be greater than about $10^9$. As used herein, the attenuation factor is calculated as follows:

$$\text{attenuation factor} = \exp(ad)$$

wherein alpha is the absorption coefficient (1/cm) and d is the thickness (cm) of the spectral filter.

The absorption coefficient and the thickness of the spectral filer can vary as long as the attenuation factor falls within a useful range at the wavelength of interest. For most applications, however, the material should have an absorption coefficient greater than about 5 $cm^{-1}$, particularly greater than about 10 $cm^{-1}$, and more particularly greater than about 50 $cm^{-1}$. In general, the spectral filter should be as thin as possible. For example, the spectral filter should have a thickness of less than about 100 mm, particularly less than 25 mm and in one embodiment can have a thickness of less than about 5 mm. It should be understood, however that the thickness of the spectral filter can be increased above the above ranges in order to provide a desired attenuation factor.

The various light absorbing agents and host materials that can be used in the present invention will now be described in more detail. For example, as stated above, in one embodiment, the light absorbing agent includes a rare earth element. Rare earth elements that can be used in the present invention include ytterbium, neodymium, thulium, erbium, holmium, dysprosium, terbium, gadolinium, europium, samarium, praseodymium, and the like.

For instance, ytterbium has been found to have a strong absorption peak between about 900 nm to about 1010 nm, and particularly between about 950 nm and 985 nm. The wavelengths that are absorbed by ytterbium, however, may be slightly affected by the host material. Erbium and neodymium also have been found to have strong absorption peaks at wavelengths less than about 1.5 microns and greater than about 0.6 microns.

As described above, however, the spectral filters made according to the present invention can also be used to absorb wavelengths greater than about 1.5 microns. For example, holmium, europium and terbium have been found to have good absorption characteristics for wavelengths from about 1.7 microns to about 2.4 microns. More particularly, holmium has an absorption peak at 1.49 microns, europium has an absorption peak at about 2.09 microns, and terbium has an absorption peak of between about 1.85 microns and about 2.1 microns.

Figure 5:
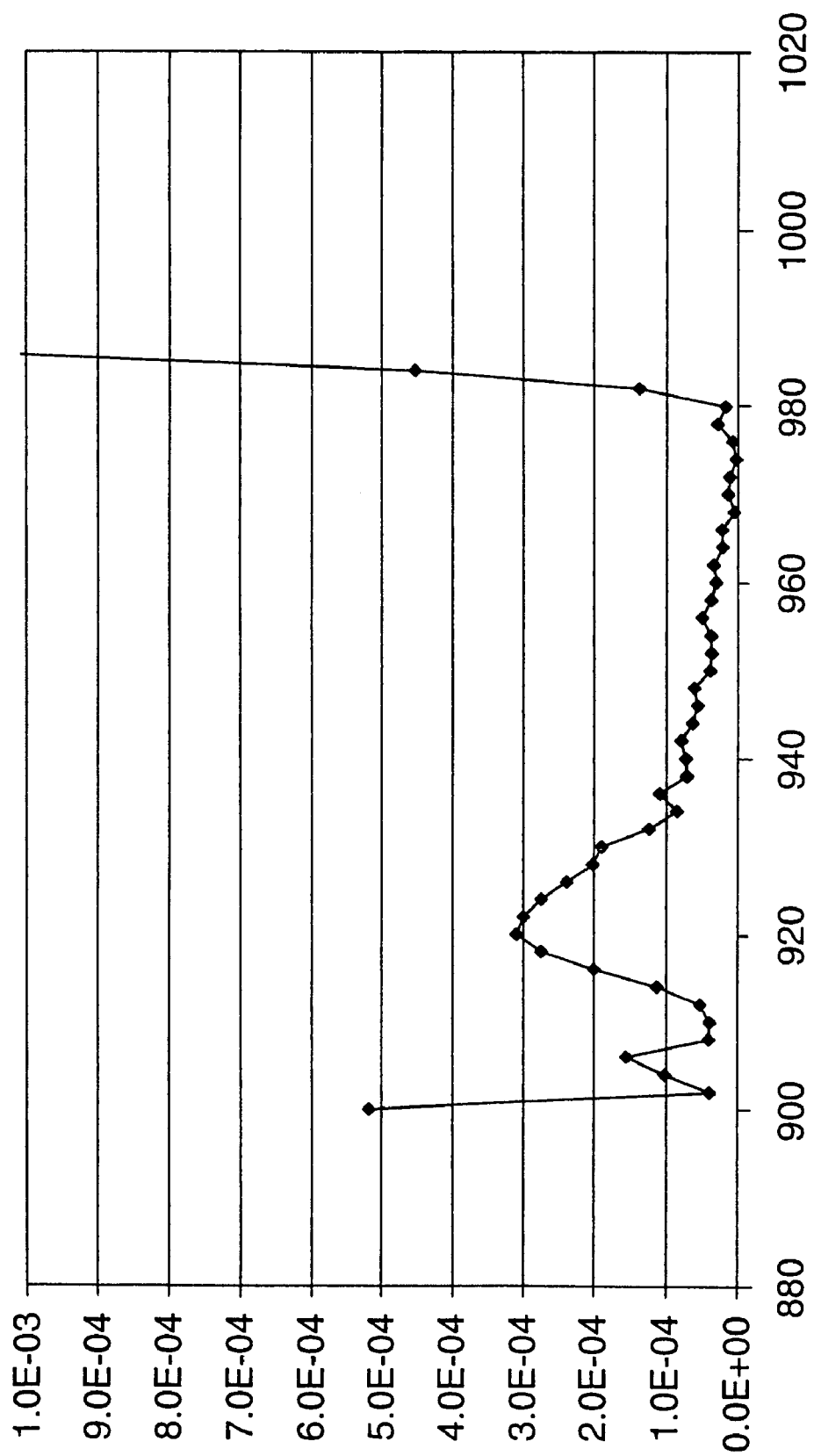
FIG. 5 is a graph of light transmission versus wavelength for a spectral filter containing ytterbium in accordance with the present invention.

In order to illustrate the absorption characteristics of rare earth elements, included as FIG. 5 is a graph of light transmission versus wavelength for a glass doped with ytterbium. The glass was obtained from the Schott Company and was sold under the designation Schott S-8050 Glass. The glass had a thickness of about 14 mm and contained about 30% by weight of ytterbium. As shown, in this embodiment, the glass doped with ytterbium is well-suited for absorbing light in a wavelength range of from about 900 nm to about 980 nm, and is particularly well-suited for absorbing light having a wavelength of from about 940 nm to about 980 nm.

As stated above, in addition to glass, the host material for the rare earth element can be a ceramic or a crystalline or a plastic material. In general, any suitable host material can be used, including liquid materials. For most applications, it is preferred that the light absorbing agent have a high solubility in the host material. Further, preferably the host materials are low cost, and can be easily formed into desired shapes. Further, preferably the host material is also resistant to chemical attack when directly exposed in the process chamber.

The amount of the light absorbing agent incorporated into the host material will depend upon the particular application and desired results. For most applications, however the host material should contain the light absorbing agent in an amount of at least 0.5% by weight, particularly at least 10% by weight, and more particularly at least 20% by weight. For instance, in one embodiment, the host material can contain the light absorbing agent in an amount from about 0.5% by weight to about 50% by weight. As described above, in some applications, the amount of the light absorbing agent in the host material can also be expressed in atomic composition concentration.

The following are various materials that can be used as host materials in accordance with the present invention. It should be understood, however, that the following list is merely exemplary and is not exhaustive.

Glass Materials
Silica, $SiO_2$
Germanium oxide $GeO_2$
Titanium dioxide $TiO_2$
Silicate glasses (Li-silicate, Na-silicate)
Silicate glass: ($Nb_2O_5$—$ZrO_2$—$SiO_2$)
Silicate glass: Schott LG-680 (laser glass)
Silicate glass: Kigre Q-246
Aluminosilicate glass
Aluminogermanosilicate glass
Borosilicate glass
Germanosilicate glasses
Phosphate glasses
Phosphate glass: (BaO—$K_2O$—$P_2O_5$)
Phosphate glass Schott LG-700, LG-750, LG-760 (laser glasses)
QX (Kigre),ADY,LY,PN, PNK phosphate glasses
NASICON phosphate glass $Na_4AlZnP_3O_{12}$
Fluorophosphate glasses
Fluoride phosphate glass
Fluoride sulphate glass
Fluoroaluminate glass
Germanate glasses (K-Germanate)
Chalcogenide glasses
Gallium Lanthanum sulphide glasses—chalcogenide
Halide glasses
Heavy metal fluoride glasses
ZB, ZBLA, ZBLAN & ZBLANP (ZBLANP=$ZrF_4$—$BaF_2$—$LaF_3$—$AlF_3$—NaF—$PbF_2$)-heavy-metal fluoride glasses
Fluorozirconate glasses
BIGaZYT
Fluoroborate glasses
Lead fluoroborate glasses (PbO—$PbF_2$—$B_2O_3$)
Lead oxyfluoride glasses (PbO—$PbF_2$)
Lead borate glasses (PbO—$B_2O_3$)
Lead fluoroborate glass (PbO—$PbF_2$—$B_2O_3$)
Tellurite glasses (YTG)
Tellurite glass (TeO2—ZnO—$Na_2O$)
Telluride glasses Crystalline Materials
Yttrium Aluminium Garnet (YAG=$Y_3Al_5O_{12}$)
Sapphire $Al_2O_3$
$Y_2O_3$, $Sc_2O_3$, $Lu_2O_3$ (sesquioxides)
Semiconductor crystals (AlAs, GaAs, GaP, InP, AlGaAs, CdTe, CdS,
CdSe, ZnS, ZnSe, ZnTe, SiC, Si)
$LaBr_3$, $LaCl_3$, $LaF_3$, $LiYF_4$, $YAlO_3$, $YVO_4$
$Sr_3Y(BO_3)_3$(BOYS)
$Ca_4Gd(BO_3)_3O$(GdCOB)
$Ca_4Y(BO_3)_3O$(YCOB)
$KGd(WO_4)_2$
$KY(WO_4)_2$
$Sr_5(PO_4)_3F$(S—FAP)—apatite structure
$Ca_5(PO_4)3_F$ (C—FAP)—apatite structure
$Ba_5(PO_4)_3F$
$LiNbO_3$
$Ca_8La_2(PO_4)_6O_2$(CLYPA)—oxoapatite Ceramic Materials
Alumina ($Al_2O_3$)
Aluminium Oxynitride (sometimes called AlON)
Ceramic forms of YAG
Silicon carbide
Silicon nitride
Spinel Instead of a rare earth element, in one embodiment, the light absorbing agent can be a metal, such as a transition metal. For example, in particular embodiments, iron or copper can be incorporated into the host material. In general, these materials can be incorporated into the host material in the same amounts as expressed above for the rare earth elements.

In additional to the host material containing a rare earth element or a metal, as described above, the light absorbing agent can also be a light absorbing dye. The light absorbing dye can be used alone or can be used in conjunction with rare earth elements and/or the above-described metals. The light absorbing dyes described herein can be incorporated into various host materials. Some light absorbing dyes, however, may be temperature sensitive. As such, the dyes, in some embodiments, may be better suited to be incorporated into plastics and solvents as opposed to some of the other host materials described above.

Many different types of light absorbing dyes can be used in the present invention depending upon the desired results. For example, the light absorbing dye can be an organic salt dye (Epolin 100 & 2000 series), a nickel complex dye (Epolin 3000 series; SDA6370, 845 nm from H. W. Sands Corp.), precious metal dyes such as a platinum complex dye and a palladium complex dye (Epolin 4000 series are platinum and palladium dyes; SDA5484, 886 nm H.W. Sands corp. is a palladium dye), a phalocyanine dye (Epolin 6000 series) or an anthraquinone dye (Epolin 9000 series). The light absorbing dyes can be used alone or in combination with other dyes. The dyes listed above can be optimized by computer stimulation before formulation. Further, a light absorbing dye can also be used in conjunction with a rare earth element.

The light absorbing dyes of the present invention can also be combined with various agents and stabilizers prior to or during incorporation into a host material. For example, thermal stabilizers and light stabilizers can be added to the dyes. For example, epolin "class V dyes" including EPO-LIGHT 4029 have high thermal stability and ultraviolet stability. Ultraviolet light stabilizers that can be added to the dyes include, for instance, cerium oxide.

Some commercially available light absorbing dyes that can be used in the present invention include the following:

| SUPPLIER NAME | PRODUCT NAME | LIGHT ABSORPTION PEAK |
|---|---|---|
| Epolin, Inc. | Epolight 2057 (Organic salt dye) | 990 nm |
| Epolin, Inc. | Epolight 4129 (Platinum or palladium dye) | 886 nm |
| Epolin, Inc. | Epolight 6089 (phthalocyanine dye) | 684 nm |

-continued

| SUPPLIER NAME | PRODUCT NAME | LIGHT ABSORPTION PEAK |
|---|---|---|
| Gentex Corp. | Filtron A187 | 840 nm |
| Gentex Corp. | Filtron A103 | 700 nm |
| H. W. Sands Corp. | Dye SDA3598 (Precious metal dye) | 738 nm |
| H. W. Sands Corp. | Dye SDA3805 | 798 nm |
| H. W. Sands Corp. | Dye SDA7973 | 845 nm |
| H. W. Sands Corp. | Dye SDA909 | 909 nm |
| H. W. Sands Corp. | Dye SDA9510 (Precious metal dye) | 951 nm |
| H. W. Sands Corp. | Dye SDA1168 | 1046 nm |

In addition to host materials doped with a rare earth element or containing a light absorbing dye, various other materials can be used to construct a spectral filter in accordance with the present invention. For example, in one embodiment, the spectral filter can be made from an oxide of a rare earth element. For instance, ytterbium oxide ($Yb_2O_3$) can be used. The oxides can be used in either a crystalline form, a glass form or a ceramic form. Further the oxides can be mixed together or with other components to form a multi-component ceramic or a glass for use in the present invention.

In another embodiment, the spectral filter can be made from a semiconductor material. The semiconductor material can be, for instance, gallium arsenide, aluminum arsenide, indium phosphide, silicon, germanium or alloys of these materials. For example gallium arsenide is well-suited for absorbing light at a wavelength of less than about 0.9 microns. When using a semiconductor material, however, it may be necessary to cool the spectral filter during operation of the processing chamber. The spectral filter can be cooled, for instance, by circulating a cooling fluid throughout or adjacent to the filter material. The cooling fluid can be for instance, air or water. Of course, any suitable cooling device can be used for this purpose.

The semi-conductor materials can also be coated with an anti-reflection coating due to the tendency of some materials to have high-refractive indices, and consequently tend to reflect a large amount of light. Anti-reflection coatings can be made from, for instance, thin films of silicon dioxide or silicon nitride. Multi-layer coatings can also be designed and applied to achieve a broadband coating that is effective over a wide spectral range. The coatings can be used alone or in combination with various absorbing elements. In one embodiment, the anti-reflective coating can be used that has a high reflectivity at the wavelength at which the pyrometer operates.

Figure 2:
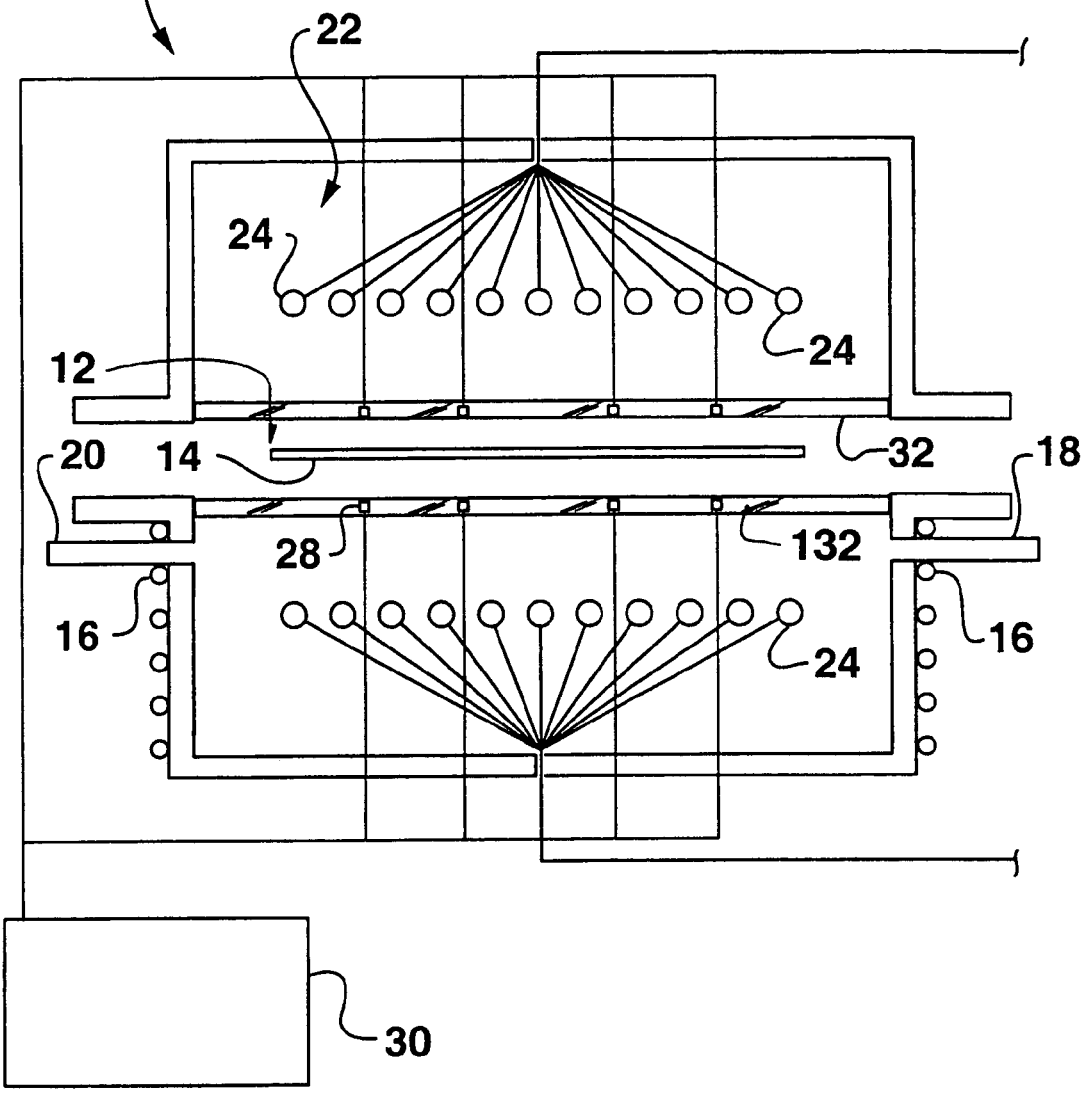
FIG. 2 is a cross-sectional view of an alternative embodiment of an apparatus for heat treating semiconductor devices in accordance with the present invention.

Referring to FIG. 2, another embodiment of a thermal processing apparatus generally 10 made in accordance with the present invention is illustrated. Like reference numerals have been included to indicate similar elements. As shown, in this embodiment, the wafer 14 is heated from both sides using two sets of light energy sources 24. Thus, in this embodiment, the apparatus includes a first spectral filter 32 and a second spectral filter 132, which serve to isolate the wafer from the lamps.

In this embodiment, the spectral filters 32 and 132 include openings for the optical fibers 28 of the radiation sensing devices 30. The openings allow radiation being emitted by the wafer to be transmitted to the radiation sensing devices. As shown, the spectral filters 32 and 132 filter the light energy being emitted by the lamps 24 into the processing chamber 12. In accordance with the present invention, the spectral filters 32 and 132 can be made from any of the materials described above.

In another embodiment of the present invention, the spectral filter 32 can be used to form the lamp housing itself. In particular, the spectral filter can be placed in direct association with the lamp filament that produces radiant energy.

In still another embodiment, the spectral filter of the present invention can be applied as a coating to the lamp envelope.

In addition to forming openings in the spectral filters 32 and 132, in an alternative embodiment, the optical fibers 28 or the pyrometer itself can be contained in regions where the host material is not doped with the light absorbing agent. In this manner, the pyrometer has a view port through these regions to take measurements from the wafer. In one embodiment, the regions can be formed by fusing undoped glass pieces into a doped glass sheet that has been formed with openings.

In addition to placing the optical fibers 28 within the spectral filters, however, the optical fibers can be placed in other locations as well. For instance, the optical fibers can also extend completely through the filter or through the chamber sidewalls.

Figure 3A:
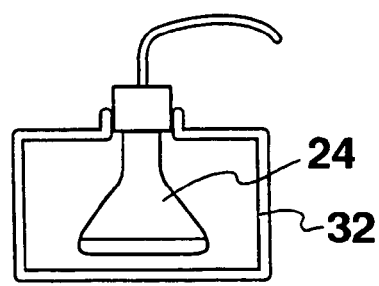
FIG. 3A is a cross-sectional view of one embodiment of a lamp surrounded by a spectral filter in accordance with the present invention.
Figure 3B:
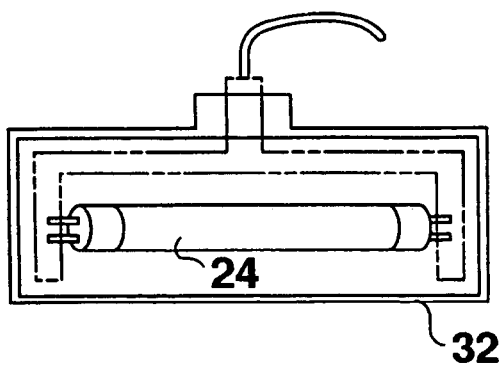
FIG. 3B is a cross-sectional view of another alternative embodiment of a lamp surrounded by a spectral filter in accordance with the present invention.

In addition to being in the form of windows that isolate the thermal processing chamber from the lamps, the spectral filters of the present invention can also be constructed in other arrangements. For instance, as shown in FIGS. 3A and 3B, the spectral filter 32 can be in the form of a sleeve that is placed around individual lamps or groups of lamps. As shown in FIG. 3A, the lamp 24 can be vertically oriented or horizontally oriented as shown in FIG. 3B. In this arrangement, the spectral filters 32 can be used alone or in conjunction with other windows that served to isolate the chamber 12.

In another embodiment of the present invention, the optical fibers 28 as shown in FIGS. 1 and 2 can be placed outside of the thermal processing chamber 12 in the same vicinity of the lamps 24. In this arrangement, light emitted by the lamps go through the spectral filter twice prior to being detected by the optical fibers. Light being emitted from the wafer, however, only travels through the spectral filter once prior to being detected by the optical fiber. Consequently, the ratio of stray light to signal will improve for making accurate temperature measurements.

In still another embodiment of the present invention, the apparatus 10 can include a pair of windows in parallel that have a first window adjacent the lamps and a second window adjacent the chamber. In this manner, a cooling fluid, such air or water, can be circulated between the two windows. One or both of the windows can be a spectral filter in accordance with the present invention. When one of the windows is not being used as a spectral filter, the window can be made from, for instance, quartz or sapphire.

Figure 4:
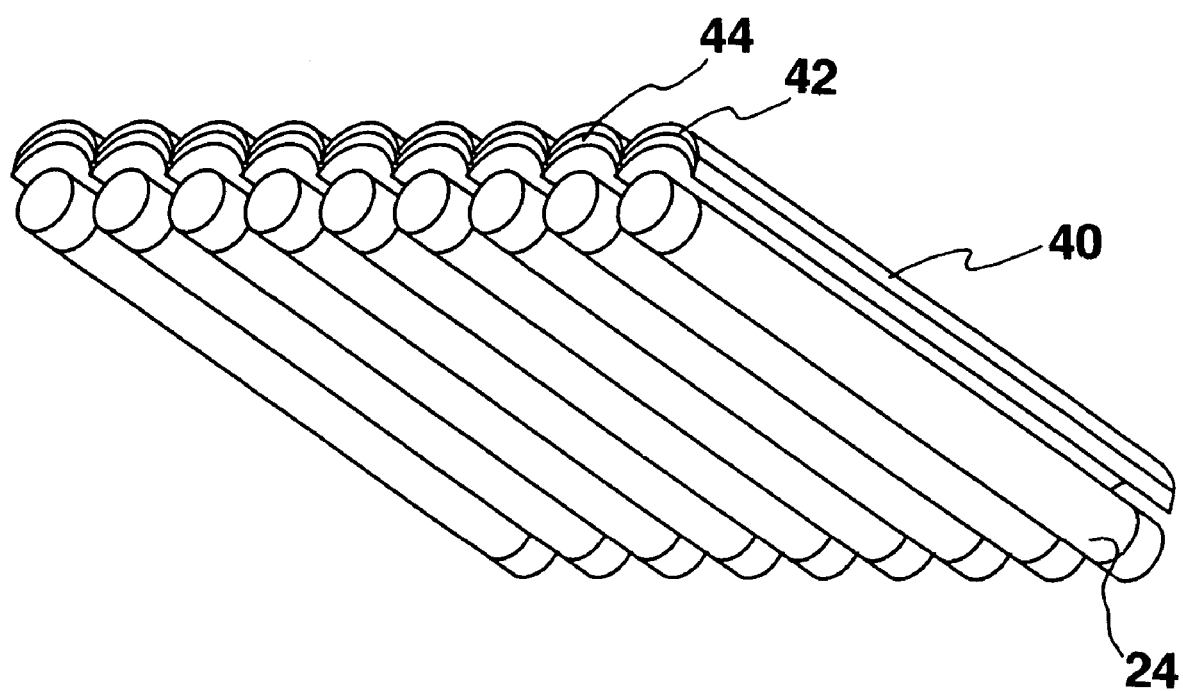
FIG. 4 is a perspective view of a plurality of lamps placed in association with one embodiment of a spectral filter made in accordance with the present invention.

Referring to FIG. 4, in another embodiment of the present invention, the spectral filter can be in the form of a reflector 40 placed in association with a plurality of lamps 24. For example, the reflector 40 can include a first layer 42 and a second layer 44. The first layer 42 can be made from a highly reflective material, such a metal. The second layer 44, can contain a light absorbing agent in accordance with the present invention. In this manner, the second layer 44 serves to filter light being reflected from the lamps and into the thermal processing chamber. Thus, although direct light emitted by the lamps at the wavelength of interest may reach the chamber, the amount of reflected light at the wavelength of interest is reduced. Depending upon the particular application, the reflector 40 can reduce the amount of light at the wavelength at which the radiation sensing devices operate in an amount sufficient for relatively accurate temperature measurements to be taken.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only and, is not intended to limit the invention so further described in such appended claims.

What is claimed:

1. An apparatus for heat treating substrates comprising:
   a thermal processing chamber for receiving a substrate;
   a radiative energy source in communication with the thermal processing chamber for emitting radiant energy into the chamber;
   at least one radiation sensing device in communication with the thermal processing chamber, the radiation sensing device being configured to sense radiation at a preselected wavelength; and
   a spectral filter being positioned in communication with the radiative energy source, the spectral filter being configured to absorb radiation being emitted by the radiative energy source at the preselected wavelength, the spectral filter comprising a light absorbing agent, the light absorbing agent comprising a material selected from the group consisting of a rare earth element, a dye, a rare earth element oxide, a semiconductor material, and a metal, the spectral filter comprising a sleeve that surrounds the radiative energy source.

2. An apparatus as defined in claim 1, wherein the radiative energy source comprises a plurality of lamps and wherein the sleeve surrounds all of the lamps.

3. An apparatus as defined in claim 1, wherein the radiative energy source comprises a plurality of lamps and wherein the apparatus comprises a corresponding plurality of spectral filters that each surround a corresponding lamp.

4. An apparatus as defined in claim 1, wherein the radiative energy source comprises a lamp containing a lamp filament, the spectral filter being integral with the lamp and comprising a lamp housing that is in direct association with and encloses the lamp filament.

5. An apparatus as defined in claim 1, wherein the radiative energy source comprises a lamp, the lamp including a lamp filament and a lamp housing, the spectral filter comprising a coating on the lamp housing.

6. An apparatus as defined in claim 1, wherein the light absorbing agent comprises a dye, the dye comprising an organic salt dye, a nickel complex dye, a precious metal dye, a phalocyanine dye, or an anthroquinone or mixtures thereof.

7. An apparatus as defined in claim 1, wherein the spectral filter comprises a host material doped with the light absorbing agent, the light absorbing agent comprising a rare earth element, the rare earth element being a material selected from the group consisting of ytterbium, neodymium, thulium, erbium, holmium, dysprosium, terbium, gadolinium, europium, samarium, praseodymium, and mixtures thereof.

8. An apparatus as defined in claim 1, wherein the predetermined wavelength is less than about 1.5 microns.

9. An apparatus as defined in claim 1, wherein the spectral filter has an attenuation factor of at least $10^3$.

10. An apparatus as defined in claim 1, wherein the light absorbing agent comprises a metal, the metal comprising iron or copper.

11. An apparatus as defined in claim 1, wherein the light absorbing agent comprises a semiconductor material, the semiconductor material comprising gallium arsenide, aluminum arsenide, silicon, germanium, indium phosphide or alloys thereof.

12. An apparatus for heat treating substrates comprising:
    a thermal processing chamber for receiving a substrate;
    a radiative energy source in communication with the thermal processing chamber for emitting radiant energy into the chamber;
    at least one radiation sensing device in communication with the thermal processing chamber, the radiation sensing device being configured to sense radiation at a preselected wavelength; and
    a first window spaced from a second window, the first and second windows being positioned in between the radiative energy source and the at least one radiation sensing device, the first window comprising a spectral filter, the spectral filter being configured to absorb radiation being emitted by the radiative energy source at the preselected wavelength, the spectral filter comprising a light absorbing agent, the light absorbing agent comprising a rare earth element or a dye.

13. An apparatus as defined in claim 12, further comprising a cooling fluid source for circulating a cooling fluid in between the first window and the second window.

14. An apparatus as defined in claim 12, wherein the spectral filter is positioned in between the radiative energy source and the second window.

15. An apparatus as defined in claim 12, wherein the spectral filter is positioned in between the second window and the at least one radiation sensing device.

16. An apparatus as defined in claim 12, wherein the light absorbing agent comprises a dye, the dye comprising an organic salt dye, a nickel complex dye, a precious metal dye, a phalocyanine dye, or an anthroquinone or mixtures thereof.

17. An apparatus as defined in claim 12, wherein the spectral filter comprises a host material doped with the light absorbing agent, the light absorbing agent comprising a rare earth element, the rare earth element being a material selected from the group consisting of ytterbium, neodymium, thulium, erbium, holmium, dysprosium, terbium, gadolinium, europium, samarium, praseodymium, and mixtures thereof.

18. An apparatus for heat treating substrates comprising:
    a thermal processing chamber for receiving a substrate;
    a radiative energy source in communication with the thermal processing chamber for emitting radiant energy into the chamber;
    at least one radiation sensing device in communication with the thermal processing chamber, the radiation sensing device being configured to sense radiation at a preselected wavelength; and
    a reflector placed in association with the radiative energy source, the reflector comprising a spectral filter configured to absorb radiation being emitted by the radiative energy source at the preselected wavelength, the spectral filter comprising a light absorbing agent, the light absorbing agent comprising a material selected from the group consisting of a rare earth element, a dye, a rare earth element oxide, a semiconductor material, and a metal.

19. An apparatus as defined in claim 18, wherein the reflector includes a first layer and a second layer, the first layer comprising a highly reflective material, the second layer comprising the spectral filter, the second layer covering the first layer.

20. An apparatus as defined in claim 18, wherein the spectral filter comprises a host material doped with the light absorbing agent, the light absorbing agent comprising a rare earth element, the rare earth element being a material selected from the group consisting of ytterbium, neodymium, thulium, erbium, holmium, dysprosium, terbium, gadolinium, europium, samarium, praseodymium, and mixtures thereof.

21. An apparatus as defined in claim 18, wherein the light absorbing agent comprises a dye, the dye comprising an organic salt dye, a nickel complex dye, a precious metal dye, a phalocyanine dye, or an anthroquinone or mixtures thereof.

22. An apparatus for heat treating substrates comprising:
a thermal processing chamber for receiving a substrate;
a radiative energy source in communication with the thermal processing chamber for emitting radiant energy into the chamber;
at least one radiation sensing device in communication with the thermal processing chamber, the radiation sensing device being configured to sense radiation at a preselected wavelength; and
a spectral filter being positioned in between the radiative energy source and the at least one radiation sensing device, the spectral filter being configured to absorb radiation being emitted by the radiative energy source at the preselected wavelength, the spectral filter comprising a light absorbing agent, the light absorbing agent comprising a semiconductor material, the spectral filter further comprising an anti-reflection coating.

23. An apparatus as defined in claim 22, wherein the anti-reflection coating comprises a film of silicon dioxide or silicon nitride.

24. An apparatus as defined in claim 22, wherein the light absorbing agent comprises a semiconductor material, the semiconductor material comprising gallium arsenide, aluminum arsenide, silicon, germanium, indium phosphide or alloys thereof.

25. An apparatus for heat treating substrates comprising:
a thermal processing chamber for receiving a substrate;
a radiative energy source in communication with the thermal processing chamber for emitting radiant energy into the chamber;
at least one radiation sensing device in communication with the thermal processing chamber, the radiation sensing device being configured to sense radiation at a preselected wavelength;
a spectral filter being positioned in between the radiative energy source and the at least one radiation sensing device, the spectral filter being configured to absorb radiation being emitted by the radiative energy source at the preselected wavelength, the spectral filter comprising a light absorbing agent, the light absorbing agent comprising a semiconductor material; and
a cooling source for cooling the spectral filter.

26. An apparatus as defined in claim 25, wherein the light absorbing agent comprises a semiconductor material, the semiconductor material comprising gallium arsenide, aluminum arsenide, silicon, germanium, indium phosphide or alloys thereof.

27. An apparatus as defined in claim 25, wherein the cooling source is configured to circulate a cooling fluid adjacent the spectral filter.

28. A process for determining the temperature of substrates in thermal processing chambers comprising:
heating a substrate in a thermal processing chamber by contacting the substrate with radiant energy;
filtering the radiant energy prior to contacting the substrate, the radiant energy being filtered by being passed through a spectral filter, the spectral filter comprising a rare earth element, a dye, a rare earth element oxide, a semiconductor material, or a metal, the spectral filter filtering a portion of the radiant energy from contacting the substrate at a certain wavelength; and
sensing radiation being emitted by the substrate at the certain wavelength, the sensed radiation being used to calculate a temperature of the substrate.

29. A process as defined in claim 28, wherein the spectral filter comprises a rare earth element.

30. A process as defined in claim 28, wherein the spectral filter comprises a host material doped with a rare earth element, the rare earth element being a material selected from the group consisting of ytterbium, neodymium, thulium, erbium, holmium, dysprosium, terbium, gadolinium, europium, samarium, praseodymium, and mixtures thereof.

31. A process as defined in claim 28, wherein the spectral filter comprises a host material containing a dye, the dye comprising an organic salt dye, a nickel complex dye, a precious metal dye, a phalocyanine dye, or an anthroquinone or mixtures thereof.

32. A process as defined in claim 28, wherein the spectral filter comprises a metal, the metal comprising iron or copper.

33. A process as defined in claim 28, wherein the spectral filter comprises a semiconductor material, the semiconductor material comprising gallium arsenide, aluminum arsenide, silicon, germanium, indium phosphide or alloys thereof.

34. A process as defined in claim 28, wherein the spectral filter comprises a rare earth element oxide.

35. A process as defined in claim 28, wherein the certain wavelength is less than about 1.5 microns.

36. A process as defined in claim 28, wherein the spectral filter has an attenuation factor of at least $10^3$.

37. A process as defined in claim 28, wherein the radiation being emitted by the substrate is sensed by a pyrometer.

38. A process as defined in claim 28, further comprising the step of cooling the spectral filter while the substrate is being heated.

39. A process as defined in claim 30, wherein the rare earth element comprises ytterbium.

* * * * *